(12) United States Patent
Ha

(10) Patent No.: US 9,672,156 B2
(45) Date of Patent: Jun. 6, 2017

(54) DYNAMIC DATA CACHES, DECODERS AND DECODING METHODS

(71) Applicant: Micron Technology, Inc., Boise, ID (US)

(72) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/083,130

(22) Filed: Mar. 28, 2016

(65) Prior Publication Data

US 2016/0210236 A1    Jul. 21, 2016

Related U.S. Application Data

(62) Division of application No. 14/262,308, filed on Apr. 25, 2014, now Pat. No. 9,299,442, which is a division of application No. 13/106,287, filed on May 12, 2011, now Pat. No. 8,711,633.

(51) Int. Cl.

| | |
|---|---|
| *G11C 16/04* | (2006.01) |
| *G06F 12/0875* | (2016.01) |
| *G11C 16/34* | (2006.01) |
| *G11C 8/10* | (2006.01) |
| *G06F 12/0893* | (2016.01) |
| *G11C 16/10* | (2006.01) |
| *G06F 12/02* | (2006.01) |

(52) U.S. Cl.
CPC ...... *G06F 12/0875* (2013.01); *G06F 12/0893* (2013.01); *G11C 8/10* (2013.01); *G11C 16/0425* (2013.01); *G11C 16/0433* (2013.01); *G11C 16/0483* (2013.01); *G11C 16/10* (2013.01); *G11C 16/3454* (2013.01); *G06F 12/0246* (2013.01); *G06F 2212/2022* (2013.01); *G06F 2212/3042* (2013.01); *G06F 2212/452* (2013.01); *G06F 2212/7203* (2013.01)

(58) Field of Classification Search
CPC ... G11C 16/0425; G11C 16/0433; G11C 8/10; G11C 29/7885; G11C 27/115
USPC ..................................................... 365/185.15
See application file for complete search history.

(56) References Cited

U.S. PATENT DOCUMENTS

| | | |
|---|---|---|
| 5,668,972 A | 9/1997 | Liu et al. |
| 6,003,119 A | 12/1999 | Silberman et al. |
| 6,081,136 A | 6/2000 | Khanna et al. |
| 6,081,156 A | 6/2000 | Choi et al. |
| 6,122,708 A | 9/2000 | Faraboschi et al. |
| 7,069,388 B1 | 6/2006 | Greenfield et al. |
| 7,242,620 B2 * | 7/2007 | Nagashima ........ G11C 16/0483 365/185.21 |

(Continued)

OTHER PUBLICATIONS

Int. Search Report and Written Opinion for Appln No. PCT/US12/036719 dated Nov. 23, 2012.

*Primary Examiner* — Pho M Luu
(74) *Attorney, Agent, or Firm* — Dorsey & Whitney LLP

(57) ABSTRACT

Dynamic data caches (DDCs), decoders and decoding methods that may fit into a smaller width area. The DDCs, decoders and decoding method may be used in flash memory devices. A single column select line may be provided to select a plurality of cached bytes, while a second select line selects a byte of the selected plurality. The column select line may be routed parallel to bit lines carrying data, while the second select line may be routed perpendicular to the bit lines.

16 Claims, 6 Drawing Sheets

(56) References Cited

U.S. PATENT DOCUMENTS

| | | |
|---|---|---|
| 7,257,678 B2 | 8/2007 | Golden et al. |
| 7,672,163 B2 | 3/2010 | Miwa |
| 8,018,770 B2 | 9/2011 | Ha |
| 8,199,574 B2 | 6/2012 | Lee |
| 8,254,174 B2 | 8/2012 | Tanaka |
| 8,484,428 B2 * | 7/2013 | Nobunaga ............ G11C 16/105 365/185.11 |
| 8,526,238 B2 | 9/2013 | Moschiano et al. |
| 8,711,633 B2 * | 4/2014 | Ha ........................... G11C 8/10 365/185.18 |
| 8,897,055 B2 * | 11/2014 | Ryu .................... G11C 7/1045 365/189.2 |
| 8,908,406 B2 | 12/2014 | Kurokawa |
| 9,214,244 B2 * | 12/2015 | Kim ........................ G11C 17/16 |
| 9,299,442 B2 * | 3/2016 | Ha ........................... G11C 8/10 |
| 2004/0223369 A1 | 11/2004 | Choi et al. |
| 2006/0280020 A1 | 12/2006 | Son et al. |
| 2008/0170433 A1 | 7/2008 | Yamada |
| 2009/0003060 A1 | 1/2009 | Fastow |
| 2010/0031096 A1 | 2/2010 | Di Iorio et al. |
| 2010/0124115 A1 | 5/2010 | Ha |
| 2010/0195399 A1 | 8/2010 | Tanaka |
| 2010/0246272 A1 | 9/2010 | Lee |
| 2012/0287722 A1 | 11/2012 | Ha |
| 2013/0155780 A1 | 6/2013 | Park |
| 2014/0233318 A1 | 8/2014 | Ha |

* cited by examiner

DYNAMIC DATA CACHES, DECODERS AND DECODING METHODS

CROSS-REFERENCE TO RELATED APPLICATIONS

This application is a divisional of U.S. patent application Ser. No. 14/262,308 filed on Apr. 25, 2014, issued as U.S. Pat. No. 9,299,442 on Mar. 29, 2016, which is a divisional of U.S. patent application Ser. No. 13/106,287 filed on May 12, 2011, issued as U.S. Pat. No. 8,711,633 on Apr. 29, 2014. The aforementioned applications and patents are incorporated by reference herein in their entirety and for any purposes.

TECHNICAL FIELD

Embodiments of the invention relate generally to semiconductor memory, and particularly, to dynamic data caches, decoders, and decoding methods.

BACKGROUND

With increasing popularity of electronic devices, such as laptop computers, portable digital assistants, digital cameras, mobile phones, digital audio players, video game consoles and the like, demand for nonvolatile memories are on the rise. Nonvolatile memories come in various types, including flash memories. Flash memories are widely used nowadays for fast information storage in electronic devices such as those mentioned above. A flash memory cell is generally programmed by storing charge on a charge storage structure, such as a charge trap or a floating gate. The charge may thereafter remain on the charge storage structure for an indefinite period even after power has been removed from the flash memory device. Flash memory devices are therefore non-volatile.

Charge is stored on the charge storage structure (referred to hereinafter by example as a "floating gate") by applying appropriate voltages to the control gate and the drain or source. For example, negative charge can be placed on the floating gate by grounding the source while applying a sufficiently large positive voltage to the control gate to attract electrons, which tunnel through the gate oxide to the floating gate from the channel region.

A flash memory cell can be read by applying a voltage to the control gate that is positive with respect to the source. The amount of charge stored on the flash memory cell determines the magnitude of the voltage that must be applied to the control gate to allow the flash memory cell to conduct current between the source and the drain. As negative charge is added to the floating gate, the threshold voltage of the flash memory cell increases thus increasing the magnitude of the voltage that must be applied to the control gate to allow the flash memory cell to conduct current. During a read operation, a read voltage is applied to the control gate that is large enough to render the cell conductive if insufficient charge is stored on the floating gate, but not large enough to render the cell conductive if sufficient charge is stored on the floating gate. During the read operation, the drain, which is used as the output terminal of the cell, is precharged to a positive voltage, and the source is coupled to ground. Therefore, if the floating gate of the flash memory cell is sufficiently charged, the drain will remain at the positive voltage. If the floating gate of the flash memory cell is not sufficiently charged, the cell will ground the drain.

Before a flash memory cell can be programmed, it may be erased by removing charge from the floating gate. The cell can be erased by applying a gate-to-source voltage to the cell that has a polarity opposite that used for programming. For example, the control gate can be grounded, and a large positive voltage applied to the source to cause the electrons to tunnel through the gate oxide and deplete charge from the floating gate. In another approach, a relatively large negative voltage is applied to the control gate, and a positive voltage, such as a supply voltage, is applied to the source region.

A typical flash memory device includes a memory array containing a large number of flash memory cells arranged in rows and columns. Two common types of flash memory array architectures are the "NAND" and "NOR" architectures, so called for the logical form in which the basic flash memory cell configuration of each is arranged. A typical flash memory array may include a large number of flash memory cells divided into a number of blocks. Each block may include a number of rows, with the cells in the same row having their control gates coupled to a common word line. Cells in the same column may have their sources and drains connected to each other in series. Thus all of the memory cells in the same column of each block are typically connected in series with each other. The drain of the upper flash memory cell in the block is coupled to a bit line through a select gate transistor. Each of the bit lines output a respective bit line signal BL1-BLN indicative of the data bit stored in the respective column of the array. The bit lines may extend through multiple blocks to respective sense amplifiers.

The storage capacity of a flash memory array can be increased by storing multiple bits of data in each flash memory cell. This can be accomplished by storing multiple levels of charge on the floating gate of each cell. These memory devices are commonly referred to as multi-bit or multi-level flash memory cells, known as "MLC memory cells." In MLC memory cells, multiple hits of binary data corresponding to distinct threshold voltage levels defined over respective voltage ranges are stored within a single cell. Each distinct threshold voltage level corresponds to a respective combination of data bits. Specifically, the number N of bits requires 2N distinct threshold voltage levels. For example, for a flash memory cell to store 2 bits of data, 4 distinct threshold voltage levels corresponding to bit states 00, 01, 10, and 11 are needed. When reading the state of the memory cell, the threshold voltage level for which the memory cell conducts current corresponds to a combination of bits representing data programmed into the cell. The two or more bits stored in each flash memory cell may be adjacent bits in the same page of data. However, more frequently, one bit is treated as a bit in one page of data, and the other bit is treated as the corresponding bit in an adjacent page of data. The bit states assigned to respective charge levels are normally the same for all rows of memory cells in an array. The bit states assigned to the flash memory cells in the array are usually implemented in hardware and thus cannot be changed during operation of the flash memory device.

FIG. 1 is a schematic illustration of a memory layout 100 including two memory arrays 102, 104 according to the prior art. The memory arrays 102, 104 may include any number and arrangement of memory cells. Each memory array 102, 104 is connected to a corresponding multiplexor region 106, 108. The multiplexor regions 106, 108 include circuitry for coupling selected blocks of the memory arrays 102, 104 to other components of the memory 100. High voltage isolation regions 110, 112 are provided which include circuitry for isolating the higher voltages which may be used in the memory arrays 102, 104 and/or the multiplexor regions 106, 108 from other components.

A dynamic data cache (DDC) region 114 is included which contains circuitry for dynamic data caches. The dynamic data caches may temporarily store data sensed from the memory arrays 102 and 104 or data that will be programmed into the memory arrays 102 and 104. As shown in FIG. 1, the dynamic data cache region 114 includes, for example, sixteen dynamic data caches. The sixteen dynamic data caches may be shared between the top and bottom memory arrays 102, 104. In other examples, eight dynamic data caches may be used. Region 116 includes circuitry for interacting with the memory arrays 102, 104 and/or DDCs 114, including a data detector, column knock-out latch, and a column select (csl) decoder. The column select decoder may provide appropriate signals to the DDCs in the DDC region 114 to select a particular DDC and allow sensed data to be stored therein, or allow the data stored therein to be programmed into the connected memory array.

FIG. 2 is a schematic illustration of portions of the memory of FIG. 1 showing additional detail. The memory array 102 includes sixteen pairs of even and odd bit lines, labeled ble0/blo0 through ble15/blo15. The multiplexer region 106 includes corresponding pairs of bias transistors 206(1) through 206(32). The bias transistors are configured to receive a bias signal at one source/drain terminal while the bit line is connected to the other source/drain terminal. The bias transistors receive either an even bias signal, blbiase, or an odd bias signal, blbiaso, at their gate terminal. The bit lines are further coupled to a source/drain terminal of a respective select transistor, 207(1) through 207(32). The select transistors 207(1-32) each receive either an odd select signal, blso, or an even select signal, blse, at their gate terminal. The blse/blso signals will select whether an even or odd bit line will be coupled to the isolation transistor. Each pair of select transistors is coupled to a respective isolation transistor within the isolation region 110. The isolation transistors 210(1)-210(16) receive an isolation signal, hviso, at their gate terminal. Accordingly, the isolation transistors 210(1)-210(16), when on, couple a selected even or odd bit line through to a DDC.

The DDC region 114 includes sixteen DDCs, labeled DDC<0> through DDC<15>. Each pair of bit lines of the memory array 102 is coupled to one of the DDCs. Each pair of bit lines of the memory array 104 is also coupled to one of the DDCs. Accordingly, the data lines 250, dw<0>, extending from the transistor 210(1) and serving the bit lines ble0 and blo0 traverses the entire length of the DDC region 114 to connect to bit lines in the memory array 104. Similarly, the data line 252, dw<15> extending from the transistor 210(16) traverses the entire length of the DDC region 114 to connect to bit lines in the memory array 104.

Column select lines, such as the csl line 260, and data verify lines, such as the dvrfy line 262 are provided for each byte of data lines to couple data stored in the DDCs to and from the two sets of data output lines dataio<0>-dataio<7> as shown. That is, for each eight data lines, one csl line and one dvrfy line are provided in the embodiment of FIG. 2. Accordingly, for each byte of data, eight data lines dw<0> through dw<7>, one csl line, and one dvrfy line are required, for a total of 10 lines per byte of data.

The dvrfy line is used to check a fail bit during programming and verify operations of the memory device. A primary data cache in the dynamic data caches may store the pass or fail bit information during the operation. In this manner, data may be verified and, if the data has failed, a fail bit may indicate that the data is not good.

DETAILED DESCRIPTION

Embodiments of the present invention include shared dynamic data caches for use with memory arrays. Examples of dynamic data caches described herein include an arrangement of components such that shared dynamic data caches are feasible in a reduced area relative to prior designs. Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 1:
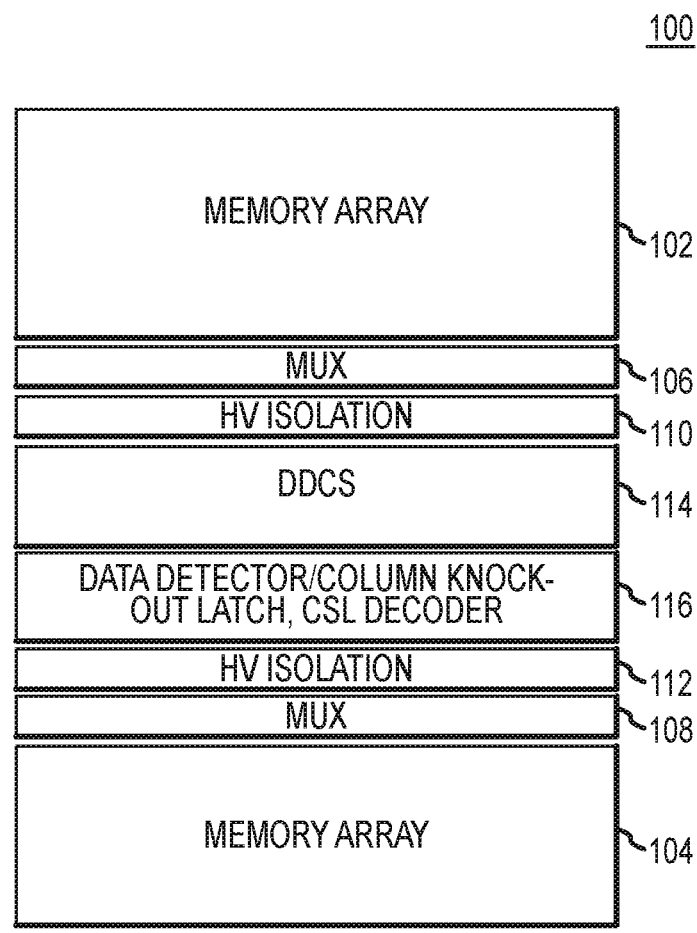
FIG. 1 is a schematic illustration of a memory layout according to the prior art.

As described above, shared DDCs have used data lines for each pair of bit lines which traverse an entire DDC layout region. Moreover, csl and vrfy lines have been provided for each byte, and the csl and vrfy lines also traverse the entire region, that is, they run parallel to the data lines as they cross the region 114. As technology has become smaller, the area allowed for DDC layouts has decreased. Accordingly, it may no longer be feasible to route as many lines as needed for the layout shown in FIGS. 1 and 2 within the space allotted for a DDC region. Embodiments of the present invention advantageously provide dynamic data caches (DDCs) and decoding methods that may fit into a smaller width area.

Figure 2:
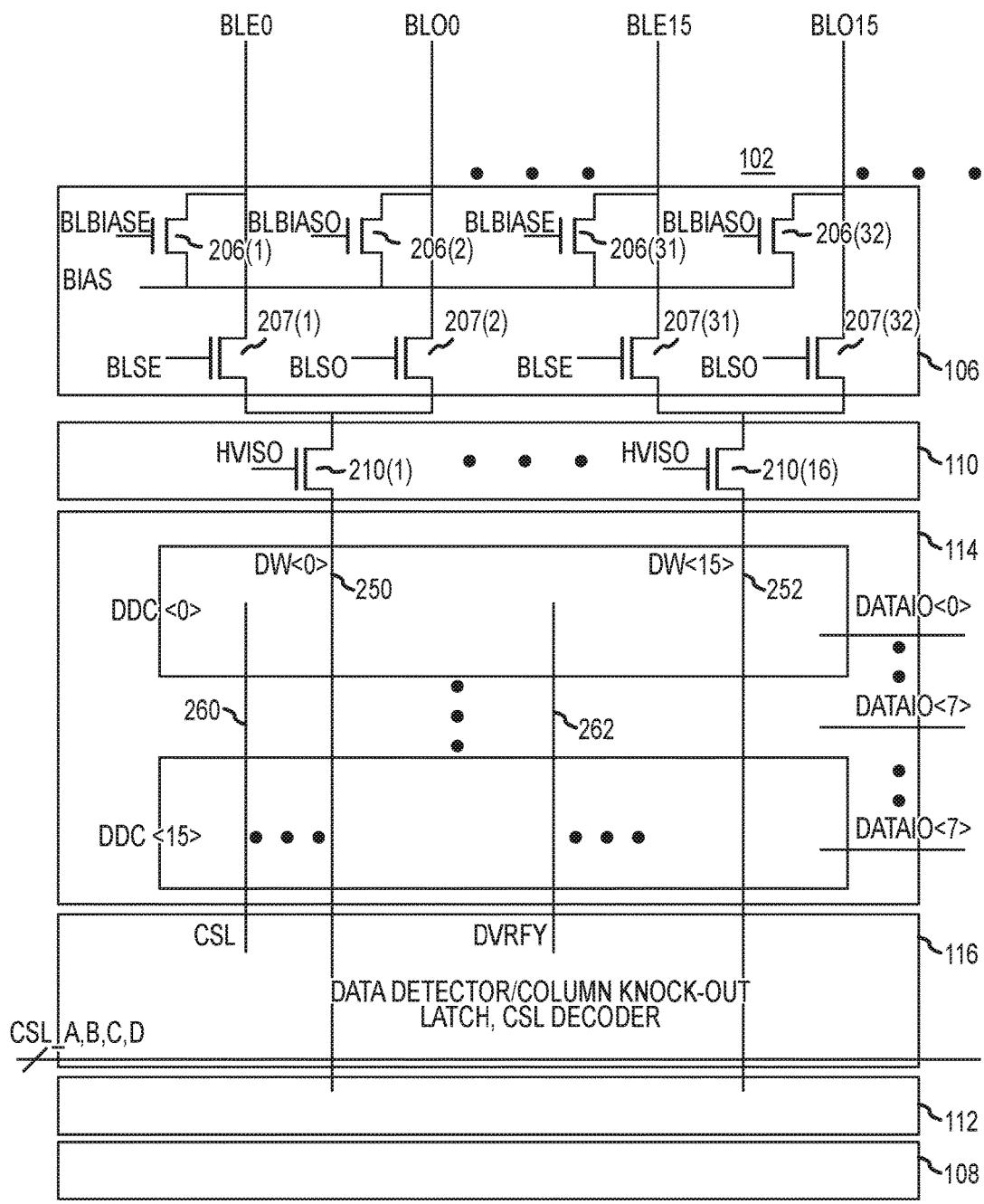
FIG. 2 is a schematic illustration of portions of the memory of FIG. 1 showing additional detail.
Figure 3:
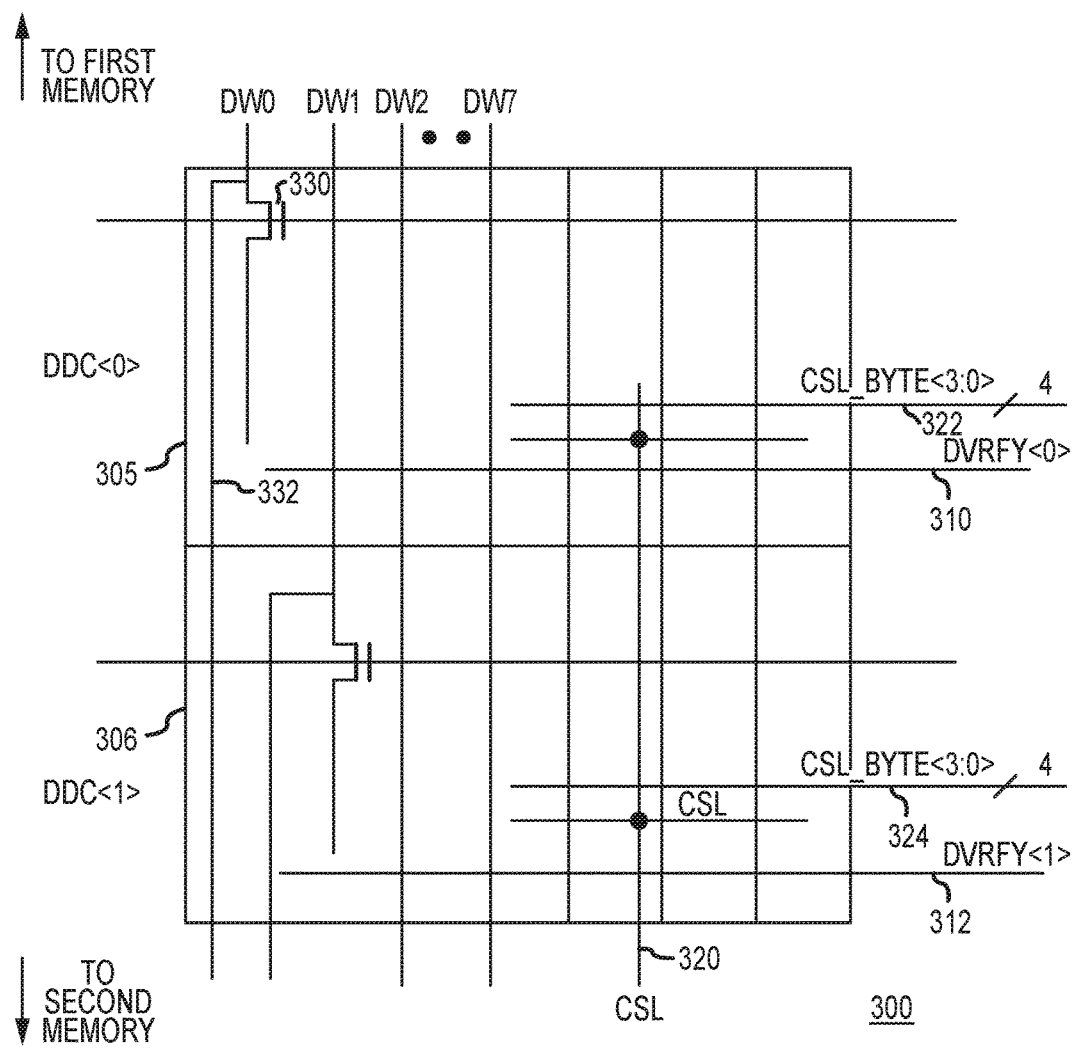
FIG. 3 is a schematic illustration of a layout for a DDC region in accordance with an embodiment of the present invention.

FIG. 3 is a schematic illustration of a layout for a DDC region in accordance with an embodiment of the present invention. The DDC region 300 includes, for example, eight DDCs, although for clarity only two DDCs 305, 306 (ddc<0>, ddc<1>) are shown in FIG. 3. Thirty-two data lines may traverse the DDC region 300 according to one embodiment. Eight data lines dw0-dw7 are shown in FIG. 3. In contrast with FIG. 2, the dvrfy lines are routed horizontally to verify data stored in each DDC. The dvrfy lines 310 and 312 are shown, labeled dvrfy<0> and dvrfy <1>. Orienting the dvrfy lines horizontally increases the amount of width available to route the data lines across the DDC region 300.

Rather than having a single csl line for each byte, as was the case in FIG. 2, in the embodiment of FIG. 3, one csl line is provided for a plurality of bytes of data lines, such as one every four bytes of data lines. In some embodiments, one csl line may be provided every eight bytes of data lines. Other frequencies may also be used. Accordingly, the csl line 320 may be used to select four bytes of data lines. To include a particular byte of data lines out of the four bytes of data lines, horizontal csl_byte select lines 322, 324 are provided. A selected csl line in combination with a csl_byte signal accordingly selects a particular byte of data lines. By removing three of the vertical csl lines for each four byte grouping, the spacing available for data lines traversing the region 300 may also be increased. In this manner, there may be sufficient width to route the thirty-two data lines across the region 300 from one memory to another.

For example, the dw0 line arrives at the DDC region 300 from a first memory. The dw0 line is coupled to a transistor 330. The dw0 line electrically continues as line 332 on to the second memory. In this manner, the dw0 line is coupled from the first memory, through the DDC region, to the second memory. Data read from or data to be programmed into either the first or second memory may be stored in the DDCs present in the DDC region 300.

Figure 4:
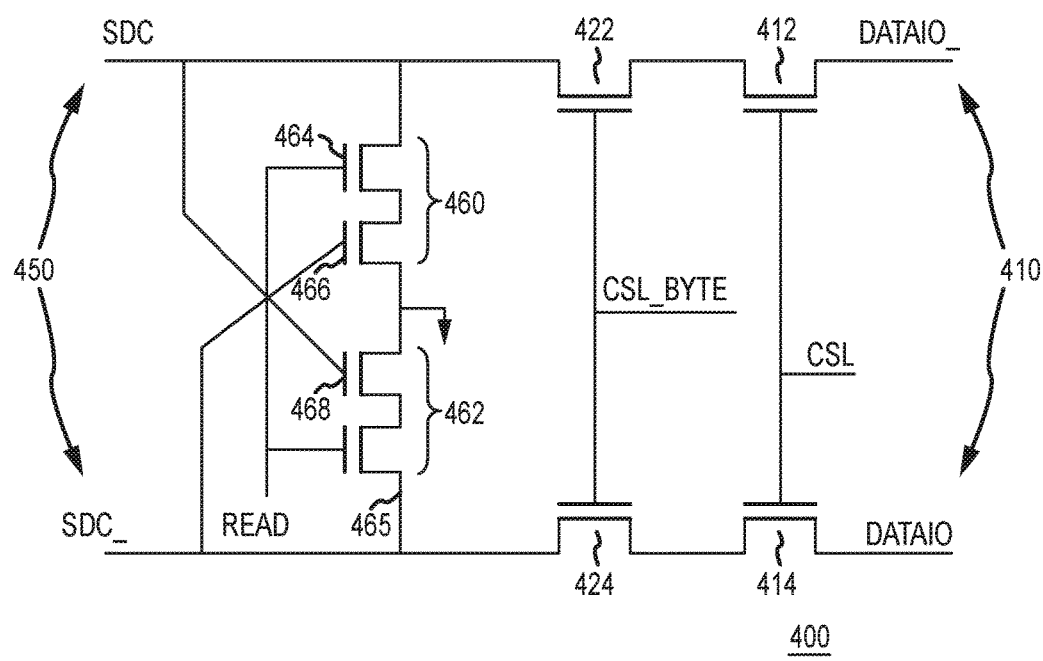
FIG. 4 is a schematic illustration of a secondary data cache accessing circuit in accordance with an embodiment of the present invention.

FIG. 4 is a schematic illustration of a secondary data cache accessing circuit in accordance with an embodiment of the present invention. As known in the art, each dynamic data cache may include a primary and a secondary data cache. Data may be read out or into the secondary data cache using data i/o lines. One data i/o line 410 including complementary dataio signals dataio and dataio_ is shown in FIG. 4. Each DDC used in a memory, including ddc<0> and ddc<1> of FIG. 3 may output stored data to a respective data i/o line, and may also receive data to be programmed from the respective data i/o line.

In previous systems, one csl line may have been provided for each byte of DDC storage. However, in the embodiment of FIG. 3 one csl line is provided for every four bytes of DDC storage and a csl_byte signal selects the particular byte to be output or input to or from the respective data i/o line. The cache access circuit 400 receives both the csl and csl_byte signals. The csl signal is provided to the gates of the transistors 412 and 414. When the transistors 412 and 414 are on, the data i/o line 410 is coupled to the source/drain terminals of the transistors 422 and 424. The transistors 422 and 424 are provided with the csl_byte signal at their gate terminals. If the transistors 422 and 424 are not turned on, the data i/o line will remain isolated from the secondary data cache line 450. If the transistors 422 and 424 have been turned on by the csl_byte signal and the transistors 412 and 414 have been turned on by the csl signal, the data i/o line 410 will be coupled to the sdc line 450. In this manner, both the csl signal and the csl_byte signal must be sufficient to turn on their respective transistors before the secondary data cache is coupled to the data i/o line.

The sdc line 450 is coupled to two cross-coupled inverters 460, 462. While the cross-coupled inverters 460, 462 may be implemented in any suitable manner, as shown in FIG. 4, each of the inverters 460, 462 includes two transistors. A first transistor of each pair 462 and 464 receive a read signal at their respective gates. A second transistor of each pair 466 and 468 receive a signal from the sdc line 450 at their respective gates. In this manner, the cross-coupled inverters 460, 462 may serve as a latch.

Figure 5:
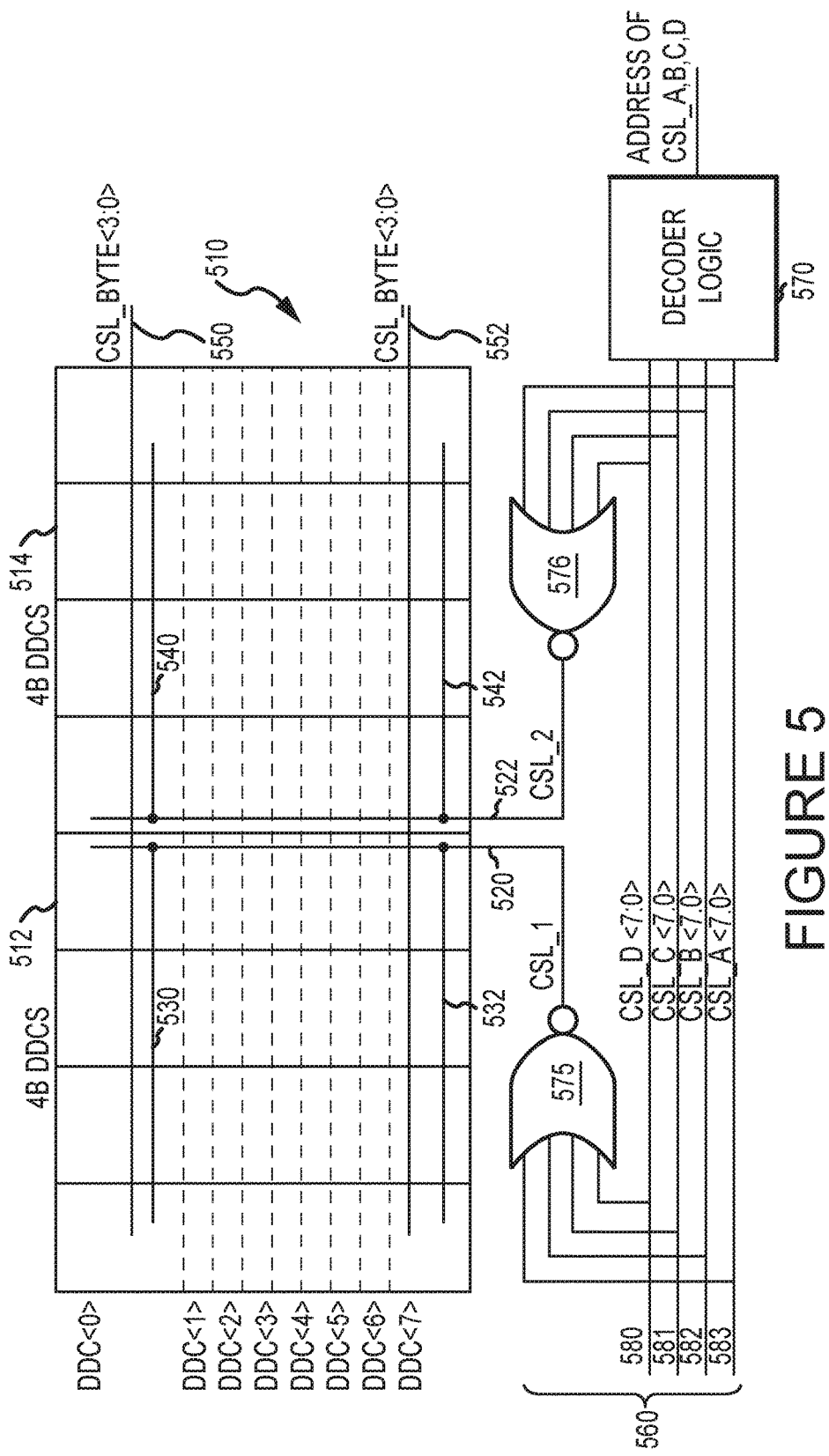
FIG. 5 is a schematic illustration of a DDC region including a CSL decoder in accordance with an embodiment of the present invention.

FIG. 5 is a schematic illustration of a DDC region including a CSL decoder in accordance with an embodiment of the present invention. The DDC region 510 includes eight DDCs, ddc<0> through ddc<7>. The DDCs are each eight byte DDCs. The DDC region 510 is divided into two four byte regions 512 and 514 by way of illustration. One csl line traverses the DDC region 510 for each of the four byte regions 512 and 514. The csl line 520 traverses across the layout regions for each of the DDCs ddc<0> through ddc<7> in the first four byte region 512. The csl line 522 traverses across the layout regions for each of the DDCs ddc<0> through ddc<7> in the second four byte region 514. Although the csl lines 520 and 522 are shown positioned at an edge of the respective four-byte DDC regions 512 and 514, the csl lines 520 and 522 may be positioned anywhere laterally along the four-byte regions in other embodiments.

Each csl line also includes horizontal branches extending across each byte of the respective four-byte region. For example, the csl line 520 is electrically connected to a branch 530. The branch 530 provides the csl_1 signal from the csl line 520 to access circuits in each byte of ddc<0> in the region 512. Although not shown in FIG. 5, similar branches connected to the csl line 520 are provided for each of the DDCs ddc<0> through ddc<7>, including the branch 532 shown in ddc<7>. The csl line 522 similarly connects to multiple branches that may provide the csl_2 signal from the csl line 522 to each byte of the DDCs in the region 514. The branch 540 provides the csl_2 signal from the csl line 522 to each byte of the ddc<0> in the region 514, for example, while the branch 542 provides the csl_2 signal from the csl line 522 to each byte of the ddc<7> in the region 514. In this manner, the csl_1 signal may be provided to each byte of the four byte DDCs in the region 512 using only a single line traversing the DDC region in parallel with the bit lines. The branches run perpendicular to the bit lines. The csl_2 signal may be provided to each byte of the four byte DDC in the region 514 using only a single line traversing the DDC region in parallel with the bit lines.

As was generally described above with reference to FIG. 4, a csl_byte signal may be provided to the DDCs to select one of the four bytes served by the csl lines. Accordingly, the csl_byte lines 550 and 552 are shown in FIG. 5. The csl_byte line 550 provides the csl_byte signal to each byte of ddc<0>, both in the region 512 and the region 514. The csl_byte line 552 provides the csl_byte signal to each byte of the ddc<7>, both in the region 512 and in the region 514. Although not shown, additional csl_byte lines are provided for each of the other DDCs in FIG. 5. A particular byte of the DDCs may be selected by providing a csl signal corresponding to the four-byte region in which the particular byte is located, and providing one or more csl_byte signals to select which byte of the four-byte region should be selected.

A csl decoder 560 is also shown in FIG. 5. The csl decoder 560 may provide (e.g. generate) the csl_1 and csl_2 signals. Decoder logic 570 may generate four csl signals—labeled csl a,b,c,d, in FIG. 5, corresponding to an address received by the decoder logic 570. The decoder logic 570 may also generate the csl_byte signal based on the address. The csl a,b,c,d signals may each be carried on multiple bus lines—with eight bus lines shown for each signal in FIG. 5. The number of bus lines may be selected based on a density of the memory array. One NOR gate is provided for each csl line to generate the corresponding csl signal. For example, the NOR gate 575 is coupled to the csl line 520. The NOR gate 575 is coupled to the lines 580-583 to receive the csl a,b,c,d signals. If the csl a,b,c,d signals provided select the four-byte region 512, the csl_1 signal may transition high, selecting the region 512. Similarly, the NOR gate 576 is also coupled to the lines 580-583 to receive the csl a,b,c,d signals. If the csl a,b,c,d signals provided select the four-byte region 514, the csl_2 signal may transition high, selecting the region 514. In other examples, a NAND gate followed by an inverter may be used in place of one or both of the NOR gates 575, 576. Note that only one NOR gate is used in this example for each csl line, corresponding to each four byte region in the example of FIG. 5. Prior systems required one NOR gate decoder for each byte when a csl line was provided for each byte. Accordingly, embodiment of the present invention may advantageously reduce the number of NOR gates required for csl decoding and may also reduce the area required to implement the csl decoders.

Figure 6:
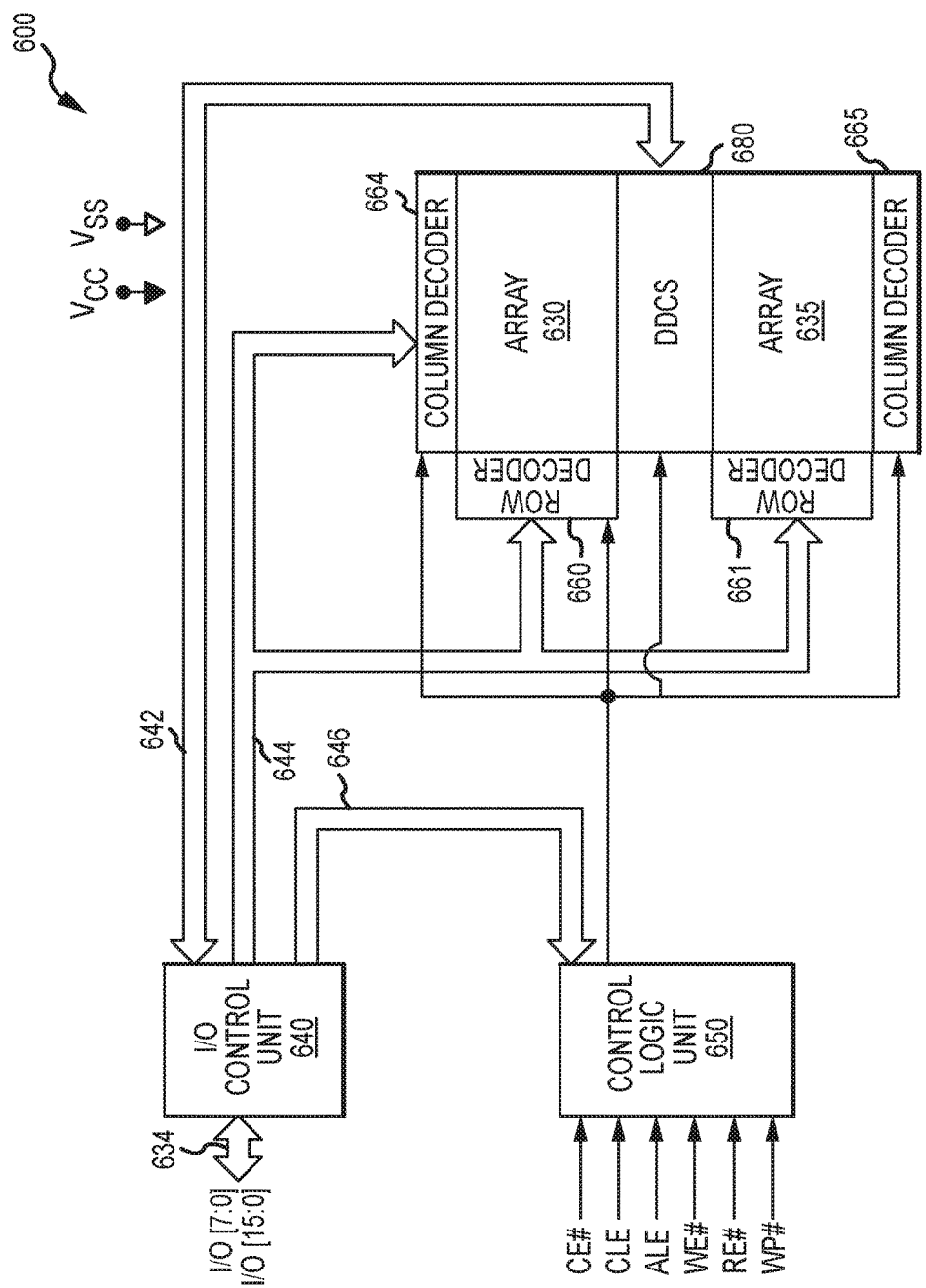
FIG. 6 is a schematic illustration of a flash memory that includes dynamic data caches in accordance with an embodiment of the present invention.

A flash memory 600 that includes dynamic data caches in accordance with an embodiment of the invention is shown in FIG. 6. The flash memory 600 includes two arrays of flash memory cells 130 and 135. The arrays of flash memory cells may be arranged in banks of rows and columns, as has generally been described above.

Most command signals, address signals and write data signals may be applied to the memory 600 as sets of sequential input/output ("I/O") signals transmitted through an I/O bus 634. Similarly, read data signals may be output from the memory 600 through the I/O bus 634. The I/O bus may be connected to an I/O control unit 640 that may route the signals between the I/O bus 634 and an internal data bus 642, an internal address bus 644, and an internal command bus 646. The memory 600 may also include a control logic unit 650 that may receive a number of control signals either externally or through the command bus 646 to control the operation of the memory 600. The control logic unit 150 may, for example, generate the csl and/or csl_byte signals described above. The address bus 644 may apply row address signals to row decoders 660, 661 and column address signals to column decoders 664, 665. The row decoders 660, 661 may each include a word line driver system, which drives the word lines of the respective arrays with appropriate voltages corresponding to the decoded row address signals and the type of memory operation. Similarly, the column decoders 664, 665 may enable write data signals to be applied to bit lines for columns corresponding to the column address signals and allow read data signals to be coupled from bit lines for columns corresponding to the column address signals.

In response to the memory commands decoded by the control logic unit 150, the flash memory cells in the arrays 630 and 635 may be erased, programmed, and/or read. The memory arrays 630, 635 may be programmed on a row-by-row or page-by-page basis. After the row address signals have been applied to the address bus 644, the I/O control unit 640 may route write data signals to the dynamic data caches 680. The dynamic data caches 680 may be laid out and csl signals decoded in accordance with FIGS. 3-5 described above. That is, the DDC region 510 and csl decoder 560 of FIG. 5 may be used to implement the DDCs 680 shown in FIG. 6. Embodiments described above may advantageously allow the two memory arrays 630, 635 to operate with a shared stack of eight DDCs within a predetermined width.

Referring again to FIG. 6, write data signals may be stored in the DDCs 680 in successive sets each having a size corresponding to the width of the I/O bus 634. The DDCs 680 may sequentially store sets of write data signals for an entire row or page of flash memory cells in the arrays 630, 635. All of the stored write data signals may then be used to program a row or page of memory cells in one or both of the arrays 630, 635 selected by the row address coupled through the address bus 644. In a similar manner, during a read operation, data signals from a row or page of memory cells selected by the row address coupled through the address bus 644 may be stored in the dynamic data caches 680. Sets of data signals corresponding in size to the width of the I/O bus 634 may then be sequentially transferred through the I/O control unit 640 from the dynamic data caches 680 to the I/O bus 634.

The memory device shown in FIG. 6 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of dynamic data caches and/or decoders described above to perform their ultimate user function.

From the foregoing it will be appreciated that, although specific embodiments of the invention have been described herein for purposes of illustration, various modifications may be made without deviating from the spirit and scope of the invention.

What is claimed is:

1. A memory device having a dynamic data cache (DDC) region including a DDC, the memory device comprising:
   a plurality of data lines, wherein each of the plurality of data lines traverses the DDC region, wherein the plurality of data lines comprises a plurality of bytes of data lines;
   a plurality of byte select lines, wherein each of the byte select lines is configured to select a respective one of the plurality of bytes of data lines;
   a single column select line configured to select the plurality of bytes of data lines; and
   a single verify line corresponding to the DDC, wherein the verify line does not run parallel to the data lines as it traverses the DDC region, wherein the verify line is configured to verify data stored in the DDC.

2. The memory device of claim 1, wherein the verify line is perpendicular to the plurality of data lines.

3. The memory device of claim 1, wherein the plurality of byte select lines do not run parallel to the data lines as they traverse the DDC region.

4. The memory device of claim 3, wherein each of the plurality of byte select lines are perpendicular to the plurality of bytes of data lines.

5. A memory device having a dynamic data cache (DDC) region including a DDC, the memory device comprising:
   a plurality of bytes of data lines, wherein each of the plurality of data lines traverses the DDC region;
   a single column select line configured to select the plurality of bytes of data lines; and
   a plurality of byte select lines, wherein each of the byte select lines is configured to select a respective one of the plurality of bytes of data lines, wherein each of the plurality of byte select lines do not run parallel to the plurality of bytes of data lines as they traverse the DDC region.

6. The memory device of claim 5, wherein each of the plurality of byte select lines are perpendicular to the plurality of bytes of data lines.

7. The memory device of claim 5, further comprising a single verify line corresponding to the DDC.

8. A memory device having a dynamic data cache (DDC) region including a DDC, the memory device comprising:
   a plurality of bytes of data lines, wherein each of the plurality of data lines traverses the DDC region;
   a single column select line configured to select the plurality of bytes of data lines;
   a plurality of byte select lines, wherein each of the byte select lines is configured to select a respective one of the plurality of bytes of data lines; and
   a single verify line corresponding to the DDC, wherein the single verify line does not run parallel to the plurality of bytes of data lines as it traverses the DDC region.

9. The memory device of claim 8, wherein the verify line is perpendicular to the plurality of bytes of data lines.

10. A memory device having a dynamic data cache (DDC) region including a DDC, the memory device comprising:
- a dynamic data cache (DDC) region comprising a plurality of DDCs;
- a plurality of data lines, wherein each of the plurality of data lines traverses the DDC region;
- a single column select line configured to select the plurality of data lines; and
- a single verify line corresponding to the plurality of DDCs,
- wherein the single verify line does not parallel to the plurality of data lines as it traverses the DDC region, and
- wherein the plurality of data lines couple a first memory array to a second memory array, and wherein the plurality of DDCs in the DDC region are configured to store data read from or programmed into either the first memory array or the second memory array.

11. The memory device of claim 10, wherein each of the plurality of data lines is coupled to at least one of the plurality of DDCs via a transistor.

12. The memory device of claim 10, wherein each of the plurality of data lines comprises a plurality of bytes of data lines.

13. The memory device of claim 12, wherein the single column select line is configured to select the plurality of bytes of data lines.

14. The memory device of claim 12, further comprising a plurality of byte select lines, wherein each of the byte select lines is configured to select a respective one of the plurality of bytes of data lines.

15. The memory device of claim 10, wherein the verify line is configured to verify data stored in the DDC region.

16. A memory device having a dynamic data cache (DDC) region including a DDC, the memory device comprising:
- a dynamic data (DDC) region comprising a plurality of DDCs;
- a plurality of data lines, wherein each of the plurality of data lines traverses the DDC region;
- a plurality of byte select lines, wherein each of the byte select lines is configured to select a respective one of the plurality of bytes of data lines;
- a single column select line configured to select the plurality of data lines; and
- a single verify line corresponding to the plurality of DDCs,
- wherein each of the plurality of data lines comprises a plurality of bytes of data lines,
- wherein the plurality of data lines couple a first memory array to a second memory array, and wherein the plurality of DDCs in the DDC region are configured to store data read from or programmed into either the first memory array or the second memory array, and
- wherein the plurality of byte select lines do not run parallel to the data lines as they traverse the DDC region.

* * * * *